(12) United States Patent
Hanna et al.

(10) Patent No.: US 7,777,521 B2
(45) Date of Patent: Aug. 17, 2010

(54) METHOD AND CIRCUITRY TO TRANSLATE A DIFFERENTIAL LOGIC SIGNAL TO A CMOS LOGIC SIGNAL

(75) Inventors: Sherif Hanna, Nashua, NH (US); Greg J. Landry, Merrimack, NH (US); Alan ReFalo, Nashua, NH (US); Jeyenth Vijayaraghavan, Nashua, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/986,980

(22) Filed: Nov. 27, 2007

(65) Prior Publication Data
US 2008/0143385 A1 Jun. 19, 2008

Related U.S. Application Data

(63) Continuation of application No. 10/852,272, filed on May 24, 2004, now Pat. No. 7,301,370.

(51) Int. Cl.
*H03K 19/094* (2006.01)
*H03K 19/0175* (2006.01)

(52) U.S. Cl. ........................................ 326/68; 327/333

(58) Field of Classification Search .................. 326/68, 326/70, 73; 327/333
See application file for complete search history.

(56) References Cited

U.S. PATENT DOCUMENTS

| | | | |
|---|---|---|---|
| 4,096,402 A | 6/1978 | Schroeder et al. | |
| 4,121,203 A | 10/1978 | Edwards et al. | |
| 4,178,558 A | 12/1979 | Nagashima et al. | |
| 4,264,872 A | 4/1981 | Suzuki | |
| 4,288,804 A | 9/1981 | Kikuchi et al. | |
| 4,412,347 A | 10/1983 | Lipcon | |
| 4,461,989 A | 7/1984 | Dotson et al. | |
| 4,486,671 A | 12/1984 | Ong | |
| 4,486,703 A | 12/1984 | Henrich | |
| 4,555,642 A | 11/1985 | Morales | |

(Continued)

FOREIGN PATENT DOCUMENTS

DE 0314034 A1 10/1988

OTHER PUBLICATIONS

USPTO Notice of Allowance for U.S. Appl. No. 10/852,272 dated Jul. 16, 2007; 4 pages.

(Continued)

*Primary Examiner*—Daniel D Chang

(57) ABSTRACT

Disclosed are various embodiments of a differential logic to CMOS logic translator including a level-shifting and buffering stage configured to receive differential inputs and to provide resulting signals with lower common mode voltage. Further, a gain stage is included to receive the resulting signals and to provide increased swing signals. A CMOS buffer is also included and is configured to receive the increased swing signals and to provide a CMOS logic output. Also disclosed is a method of translating a differential logic signal to a CMOS logic signal including level-shifting and buffering differential input signals to provide resulting signals with lower common mode voltage. The method also includes using a gain stage to provide increased swing signals from the resulting lower common mode signals and using a CMOS buffer to provide a CMOS output from the increased swing signals.

20 Claims, 3 Drawing Sheets

U.S. PATENT DOCUMENTS

| | | | |
|---|---|---|---|
| 4,713,600 A | 12/1987 | Tsugaru et al. |
| 4,763,021 A | 8/1988 | Stickel |
| 4,820,937 A | 4/1989 | Hsieh |
| 4,835,420 A | 5/1989 | Rosky |
| 4,907,121 A | 3/1990 | Hrassky |
| 4,943,738 A | 7/1990 | Hoshi |
| 4,965,469 A | 10/1990 | Kondoh et al. |
| 4,992,677 A | 2/1991 | Ishibashi et al. |
| 4,994,955 A | 2/1991 | Schoofs et al. |
| 5,027,014 A | 6/1991 | Bass et al. |
| 5,032,740 A | 7/1991 | Kannegundla |
| 5,043,674 A | 8/1991 | Bonaccio et al. |
| 5,128,560 A | 7/1992 | Chern et al. |
| 5,134,308 A | 7/1992 | Boemi |
| 5,155,386 A | 10/1992 | Abdi |
| 5,166,558 A | 11/1992 | Ohsawa |
| 5,184,035 A | 2/1993 | Sugibayashi |
| 5,202,590 A | 4/1993 | Liepold et al. |
| 5,206,550 A | 4/1993 | Mehta |
| 5,223,753 A | 6/1993 | Lee et al. |
| 5,245,224 A | 9/1993 | Suzuki et al. |
| 5,257,146 A | 10/1993 | Price, Jr. et al. |
| 5,280,199 A | 1/1994 | Itakura |
| 5,280,200 A | 1/1994 | Tarng |
| 5,283,484 A | 2/1994 | Brehmer et al. |
| 5,296,760 A | 3/1994 | Oertle et al. |
| 5,300,832 A | 4/1994 | Rogers |
| 5,300,835 A | 4/1994 | Assar et al. |
| 5,349,305 A | 9/1994 | Hsiao et al. |
| 5,371,552 A | 12/1994 | Brummette et al. |
| 5,373,435 A | 12/1994 | Jayaraman et al. |
| 5,378,943 A | 1/1995 | Dennard |
| 5,382,917 A | 1/1995 | Miyake et al. |
| 5,384,503 A | 1/1995 | Shu et al. |
| 5,390,101 A | 2/1995 | Brown |
| 5,392,205 A | 2/1995 | Zavaleta |
| 5,394,037 A | 2/1995 | Josephson et al. |
| 5,404,333 A | 4/1995 | Mehta |
| 5,412,348 A | 5/1995 | Kasha et al. |
| 5,418,476 A | 5/1995 | Strauss |
| 5,418,482 A | 5/1995 | Wong et al. |
| 5,426,376 A | 6/1995 | Wong et al. |
| 5,426,385 A | 6/1995 | Lai |
| 5,434,717 A | 7/1995 | Yoshinaga et al. |
| 5,438,287 A | 8/1995 | Faue |
| 5,440,162 A | 8/1995 | Worley et al. |
| 5,453,704 A | 9/1995 | Kawashima |
| 5,485,106 A | 1/1996 | Drost et al. |
| 5,521,531 A | 5/1996 | Okuzumi |
| 5,528,172 A | 6/1996 | Sundstrom |
| 5,539,334 A | 7/1996 | Clapp et al. |
| 5,541,534 A | 7/1996 | Cao et al. |
| 5,606,268 A | 2/1997 | Van Brunt |
| 5,621,340 A | 4/1997 | Lee et al. |
| 5,682,108 A | 10/1997 | Min |
| 5,684,415 A | 11/1997 | McManus |
| 5,691,654 A | 11/1997 | Green et al. |
| 5,710,527 A | 1/1998 | Yaguchi et al. |
| 5,731,725 A | 3/1998 | Rothenberger et al. |
| 5,732,015 A | 3/1998 | Kazerounian et al. |
| 5,744,982 A | 4/1998 | Chu |
| 5,821,799 A | 10/1998 | Saripella |
| 5,821,800 A | 10/1998 | Le et al. |
| 5,850,365 A | 12/1998 | Reese et al. |
| 5,892,371 A | 4/1999 | Maley |
| 5,903,142 A | 5/1999 | Mann |
| 5,929,656 A | 7/1999 | Pagones |
| 5,933,025 A | 8/1999 | Nance et al. |
| 5,939,904 A | 8/1999 | Fetterman et al. |
| 5,949,710 A | 9/1999 | Pass et al. |
| 5,952,868 A | 9/1999 | Gowni et al. |
| 5,982,220 A | 11/1999 | Kim |
| 6,005,413 A | 12/1999 | Schmitt |
| 6,023,174 A | 2/2000 | Kirsch |
| 6,040,729 A | 3/2000 | Sanchez et al. |
| 6,069,515 A | 5/2000 | Singh |
| 6,094,083 A | 7/2000 | Noda |
| 6,107,857 A | 8/2000 | Orisaka et al. |
| 6,107,882 A | 8/2000 | Gabara et al. |
| 6,114,874 A * | 9/2000 | Bales ......................... 326/66 |
| 6,130,548 A | 10/2000 | Koifman |
| 6,175,952 B1 | 1/2001 | Patel et al. |
| 6,191,636 B1 | 2/2001 | Cress et al. |
| 6,191,989 B1 * | 2/2001 | Luk et al. ................... 365/207 |
| 6,211,699 B1 * | 4/2001 | Sudjian ....................... 326/66 |
| 6,236,242 B1 | 5/2001 | Hedberg |
| 6,239,646 B1 | 5/2001 | Navabi et al. |
| 6,240,027 B1 | 5/2001 | Lee et al. |
| 6,252,422 B1 | 6/2001 | Patel et al. |
| 6,281,753 B1 | 8/2001 | Corsi et al. |
| 6,292,025 B1 | 9/2001 | Okumura |
| 6,294,932 B1 | 9/2001 | Watarai |
| 6,323,683 B1 | 11/2001 | Katikaneni |
| 6,388,469 B1 | 5/2002 | Hunt et al. |
| 6,400,189 B2 | 6/2002 | McDaniel |
| 6,483,349 B2 | 11/2002 | Sakata et al. |
| 6,483,386 B1 | 11/2002 | Cress et al. |
| 6,501,306 B1 | 12/2002 | Kim et al. |
| 6,512,407 B2 | 1/2003 | Horan et al. |
| 6,552,569 B2 | 4/2003 | Wert |
| 6,590,420 B1 | 7/2003 | Mnich et al. |
| 6,611,157 B2 | 8/2003 | Usui |
| 6,617,888 B2 | 9/2003 | Volk |
| 6,768,352 B1 | 7/2004 | Maher et al. |
| 6,784,700 B1 | 8/2004 | Hunt et al. |
| 6,801,064 B1 | 10/2004 | Hunt et al. |
| 7,173,453 B2 * | 2/2007 | Prather et al. ................. 326/80 |
| 7,301,370 B1 | 11/2007 | Hanna et al. |
| 2005/0134314 A1 * | 6/2005 | Prather et al. ................. 326/86 |

OTHER PUBLICATIONS

USPTO Notice of Allowance for U.S. Appl. No. 10/852,272 dated Mar. 8, 2007; 4 pages.
USPTO Final Rejection for U.S. Appl. No. 10/852,272 dated Nov. 2, 2006; 6 pages.
USPTO Non-Final Rejection for U.S. Appl. No. 10/852,272 dated Apr. 19, 2006; 8 pages.
USPTO Non-Final Rejection for U.S. Appl. No. 10/852,272 dated Aug. 25, 2005; 6 pages.
USPTO Notice of Allowance for U.S. Appl. No. 11/015,059 dated Sep. 28, 2006; 6 pages.
USPTO Non-Final Rejection for U.S. Appl. No. 11/015,059 dated May 10, 2006; 7 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
USPTO Notice of Allowance for U.S. Appl. No. 10/228,436 dated Mar. 18, 2004; 6 pages.
USPTO Non-Final Rejection for U.S. Appl. No. 10/228,436 dated Nov. 13, 2003; 6 pages.
USPTO Advisory Action for U.S. Appl. No. 10/228,436 dated Oct. 8, 2003; 3 pages.
USPTO Final Rejection for U.S. Appl. No. 10/228,436 dated Jul. 16, 2003; 8 pages.
USPTO Non-Final Rejection for U.S. Appl. No. 10/228,436 dated Mar. 27, 2003; 9 pages.
USPTO Notice of Allowance for U.S. Appl. No. 10/233,696 dated Apr. 22, 2004; 7 pages.
USPTO Advisory Action for U.S. Appl. No. 10/233,696 dated Mar. 26, 2004; 3 pages.
USPTO Final Rejection for U.S. Appl. No. 10/233,696 dated Jan. 21, 2004; 9 pages.

USPTO Non-Final Rejection for U.S. Appl. No. 10/233,696 dated Oct. 3, 2002; 6 pages.
USPTO Notice of Allowance for U.S. Appl. No. 08/883,971 dated Nov. 2, 1998; 1 page.
USPTO Non-Final Rejection for U.S. Appl. No. 08/883,971 dated Jun. 30, 1998; 3 pages.
USPTO Non-Final Rejection for U.S. Appl. No. 08/883,971 dated Feb. 20, 1998; 3 pages.
USPTO Notice of Allowance for U.S. Appl. No. 09/400,685 dated Sep. 28, 2000; 1 page.
USPTO Non-Final Rejection for U.S. Appl. No. 09/400,685 dated Aug. 28, 1999; 8 pages.
USPTO Notice of Allowance for U.S. Appl. No. 09/373,870 dated Aug. 28, 2001; 3 pages.
USPTO Non-Final Rejection for U.S. Appl. No. 09/373,870 dated Oct. 25, 2000; 6 pages.
USPTO Notice of Allowance for U.S. Appl. No. 09/384,510 dated Jul. 25, 2001; 3 pages.
USPTO Final Rejection for U.S. Appl. No. 09/384,510 dated May 1, 2001; 6 pages.
USPTO Non-Final Rejection for U.S. Appl. No. 09/384,510 dated Oct. 25, 2000; 6 pages.
USPTO Notice of Allowance for U.S. Appl. No. 09/676,539 dated Jul. 15, 2002; 7 pages.
USPTO Non-Final Rejection for U.S. Appl. No. 09/676,539 dated Feb. 26, 2002; 5 pages.
USPTO Non-Final Rejection for U.S. Appl. No. 09/676,539 dated Aug. 21, 2001; 6 pages.
USPTO Notice of Allowance for U.S. Appl. No. 08/933,139 dated May 19, 1999; 8 pages.
USPTO Non-Final Rejection for U.S. Appl. No. 08/933,139 dated Oct. 5, 1998; 9 pages.
Cypress Preliminary Ultra37000 CPLD Family, 5V, 3.3V, ISR High-Performance CPLDs, Cypress Semiconductor Corporation, Aug. 13, 1999, pp. 1-63; 63 pages.
USPTO Notice of Allowance for U.S. Appl. No. 09/182,556 dated Jan. 26, 2001; 3 pages.
USPTO Non-Final Rejection for U.S. Appl. No. 09/182,556 dated Sep. 8, 2000; 7 pages.
USPTO Final Rejection for U.S. Appl. No. 09/182,556 dated May 23, 2000; 8 pages.
USPTO Non-Final Rejection for U.S. Appl. No. 09/182,556 dated Jan. 6, 2000; 7 pages.
USPTO Notice of Allowance for U.S. Appl. No. 08/572,618 dated Apr. 25, 1997; 1 page.
USPTO Non-Final Rejection for U.S. Appl. No. 08/572,618 dated Sep. 18, 1996; 2 pages.
Horenstein, "Digital Circuits, CMOS Logic Family," Microelectronic Circuit & Devices, Chapter 16, 1990, pp. 752-755; 4 pages.

* cited by examiner

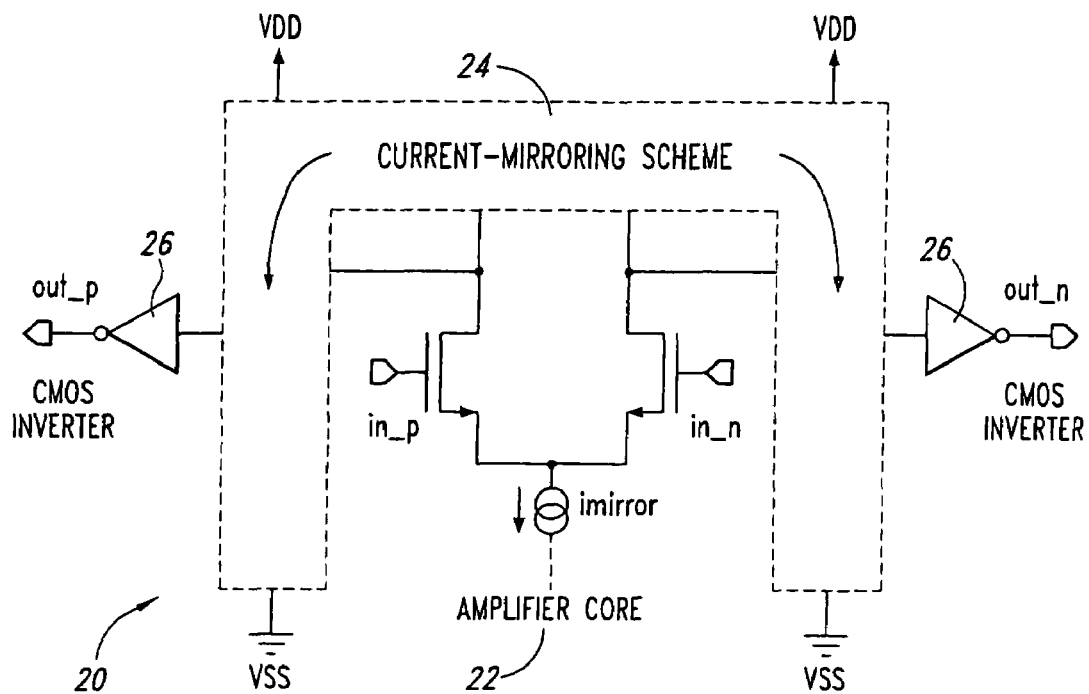
Fig. 1
*(Conventional)*
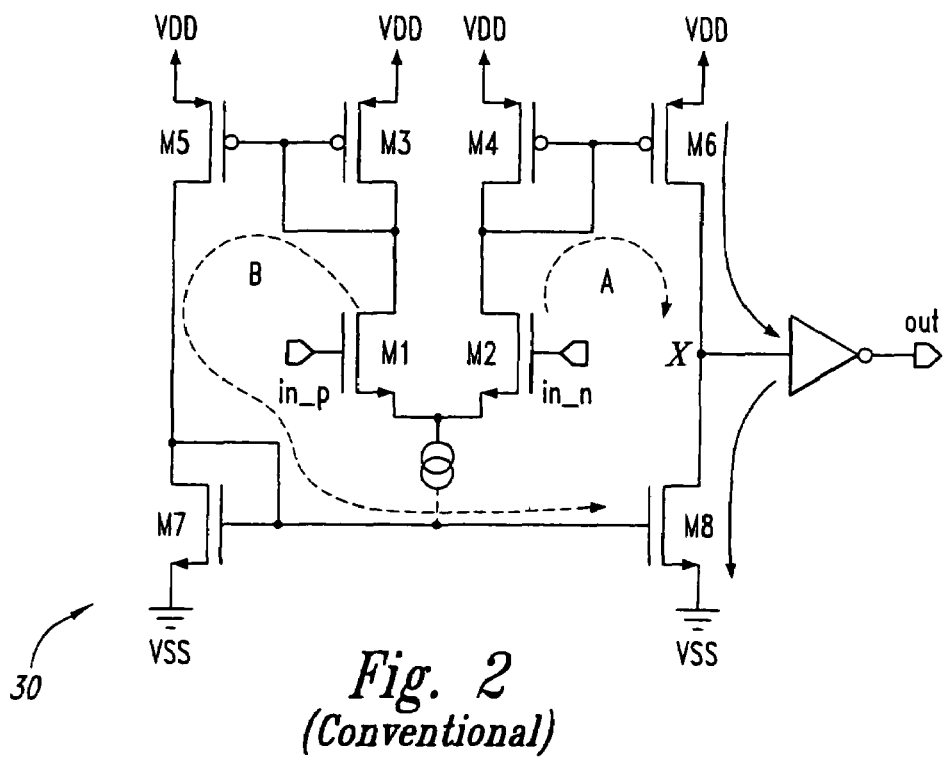
Fig. 2
*(Conventional)*

US 7,777,521 B2

METHOD AND CIRCUITRY TO TRANSLATE A DIFFERENTIAL LOGIC SIGNAL TO A CMOS LOGIC SIGNAL

CROSS REFERENCE TO RELATED APPLICATION

This application claims the benefit under 35 U.S.C. §119(e) to U.S. Provisional Application No. 60/472,973 entitled "A HIGH-SPEED DIFFERENTIAL LOGIC TO CMOS TRANSLATOR ARCHITECTURE WITH LOW DATA-DEPENDENT JITTER AND DUTY CYCLE DISTORTION," filed May 22, 2003, the disclosure of which is hereby incorporated by reference in its entirety.

TECHNICAL FIELD

The present invention relates generally to integrated circuits and, more particularly, to circuitry for translating a differential logic signal to a CMOS logic signal.

BACKGROUND OF THE INVENTION

Many chip interfaces use differential signaling, such as Low-Voltage Differential Signaling (LVDS), for high-speed signal transmission such as multi gigahertz applications as an example. However, most internal chip circuit functions are implemented using full CMOS logic type signals. Therefore, translation circuits for converting differential signals into CMOS logic signals are required. In addition, many chips use differential logic for high-speed internal signals, and CMOS logic for lower speed internal signals. The conversion between these types of signals on-chip also requires translation circuits. Differential logic generally includes situations where two signal lines, typically complements of each other, are used to represent a single logic value, as opposed to one signal line.

FIG. 1 illustrates a conventional architecture 20 for differential to CMOS level translation. In FIG. 1, the architecture for translation relies on an amplifier core 22, augmented by a current-mirroring scheme 24, and a CMOS buffer 26 to output the signal in full CMOS levels. FIG. 2 shows a circuit implementation 30 according to this conventional architecture.

In FIG. 2, as differential inputs in_p and in_n switch, the current is switched between the left and right legs of the differential pair. Depending on which of the two inputs is higher, current can be sourced by either transistors M3 or M4. If through transistor M3, the current is mirrored through transistors M5, M7, and then M8 (current path B as shown by a dashed line). If through transistor M4, then it is mirrored through transistor M6 (current path A as shown by a dashed line). Transistors M6 and M8 constitute the output stage of the translator. As a result, the node x is either charged up through M6 (if in_n>in_p), or discharged through M8 (if in_p>in_n). The voltage drops across transistors M6 and MB are usually minimized to bring the value of node x as close as possible to the rails, as formed by supply VDD and ground VSS. This can ensure that the output inverter is tripped correctly.

The above architecture 30 suffers from a few disadvantages. One such disadvantage is that unequal current switching paths can lead to jitter in timing. If the current switching follows a longer path for one logic value (e.g., node x discharging) and not the other (e.g., node x charging) then it takes longer for the translator to output that logic value. Of course, there are many current-switching schemes that can overcome this problem. However, most such approaches add devices to the circuit. Adding more devices to equalize the current paths can lead to additional capacitance in the circuit, thus decreasing the circuit's bandwidth.

Another disadvantage is that node x is a high-impedance node, due to the saturation resistances of transistors M6 and M8, which are generally large. This means that slight changes in current through those two transistors can lead to large voltage changes at node x. In turn, the voltage at node x is not well controlled. Mismatch between transistors M6 and M8 would also significantly affect the voltage value of node x. Of course, it is impossible to match M6 and M8 over all process corners, which means that node x is, in practice, not well controlled.

Another disadvantage of this conventional approach 30 is that variations in transistor performance over process, voltage, and temperature (PVT) corners can lead to varying jitter performance. Even if relatively low jitter can be achieved by matching transistors in the amplifier section and in the output inverter for one corner, the matching would no longer be applicable if the transistor silicon performance changed due to process variations or if operating environment parameters changed.

As recognized by the present inventors, what is needed is a high-speed differential logic to CMOS logic translator architecture, outputting signals with low rise/fall time skew. It is against this background that embodiments of the present invention have been developed.

SUMMARY

According to one broad aspect of an embodiment of the present invention, disclosed herein is a differential logic to CMOS logic translator includes a level-shifting and buffering stage configured to receive differential inputs and to provide resulting signals with lower common mode voltage. Further, a gain stage is included to receive the resulting signals and to provide increased swing signals. A CMOS buffer is also included and is configured to receive the increased swing signals and to provide a CMOS logic output.

According to another aspect of the embodiment, a method of translating a differential logic signal to a CMOS logic signal includes level-shifting and buffering differential input signals to provide resulting signals with lower common mode voltage. The method also includes using a gain stage to provide increased swing signals from the resulting lower common mode signals and using a CMOS buffer to provide a CMOS output from the increased swing signals. The method may also include reducing signal skew within the CMOS buffer.

According to another broad aspect of an embodiment of the present invention, disclosed herein is a translator for translating differential input signals into a CMOS logic output. In one example, the translator may include a level-shifting and buffering stage configured to receive the differential input signals and to provide a set of level shifted signals; a gain stage configured to receive the set of level shifted signals and to provide a set of increased swing signals; and a CMOS buffer configured to receive the set of increased swing signals and to provide a CMOS logic output. In one embodiment, the level-shifting and buffering stage comprises a first passively-loaded differential structure configured to receive the differential input signals and to provide a set of intermediate level shifted signals; and a second passively-loaded differential structure configured to receive the set of intermediate level shifted signals and to provide the set of level shifted signals.

In one example, the level shifting and buffering stage includes a first buffer receiving the differential input signals and a second buffer, the second buffer receiving an output from the first buffer. The first buffer may include a first transistor receiving a first input signal of the differential input signals and a second transistor receiving a second input signal of the differential input signals, the first transistor and the second transistor connected in parallel at a node, and a third transistor connected between the node and ground. The first and second transistors may be n-channel transistors, in one example. The gain stage may include one or more cross-coupled inverters coupled with the set of level shifted signals.

In another embodiment, the translator may include a pair of CMOS inverters receiving the set of increased swing signals, the CMOS inverters bringing the set of increased swing signals to CMOS logic voltage levels. The CMOS buffer may include a pull-down path receiving a first of the set of increased swing signals, and a pull-up path receiving a second of the set of increased swing signals, the pull-down path and the pull-up path coupled together to form the CMOS logic output.

In one example, the pull-down path may include a first transistor and a second transistor connected in series, the first transistor coupled between a supply voltage and the second transistor, the second transistor coupled between ground and the first transistor, both the first and second transistors controlled by the first of the set of increased swing signals. The pull-up path may include a third transistor and a fourth transistor connected in series, the third transistor coupled between a supply voltage and the fourth transistor, the fourth transistor coupled between ground and the third transistor. Further, the translator may include means for reducing any signal skew received by or within the CMOS buffer.

According to another broad aspect of another embodiment of the present invention, disclosed herein is an integrated circuit having at least one set differential logic signals; and a translator for translating the at least one set of differential logic signals into a CMOS logic signal. In one example, the translator may include a buffering and level shifting stage configured to receive the at least one set of differential logic signals and to provide a first output; a gain stage coupled with the first output and providing a second output; and a CMOS buffer stage coupled with the second output and providing the CMOS logic signal. The CMOS buffer stage of the translator may include means for reducing signal skew within the CMOS buffer.

The features, utilities and advantages of the various embodiments of the invention will be apparent from the following more particular description of embodiments of the invention as illustrated in the accompanying drawings.

BRIEF DESCRIPTION OF THE DRAWINGS

FIG. 1 is a diagram of a conventional differential logic to CMOS logic translation architecture.

FIG. 2 is a schematic diagram of a conventional differential logic to CMOS logic translation circuit.

DETAILED DESCRIPTION

Disclosed herein is a circuit which can be used as a translator of a differential logic pair of signals into a single ended CMOS logic signal. The circuit can be included in an integrated circuit, such as where high speed data differential logic signals are used. Various embodiments of the present invention are described herein.

Figure 3:
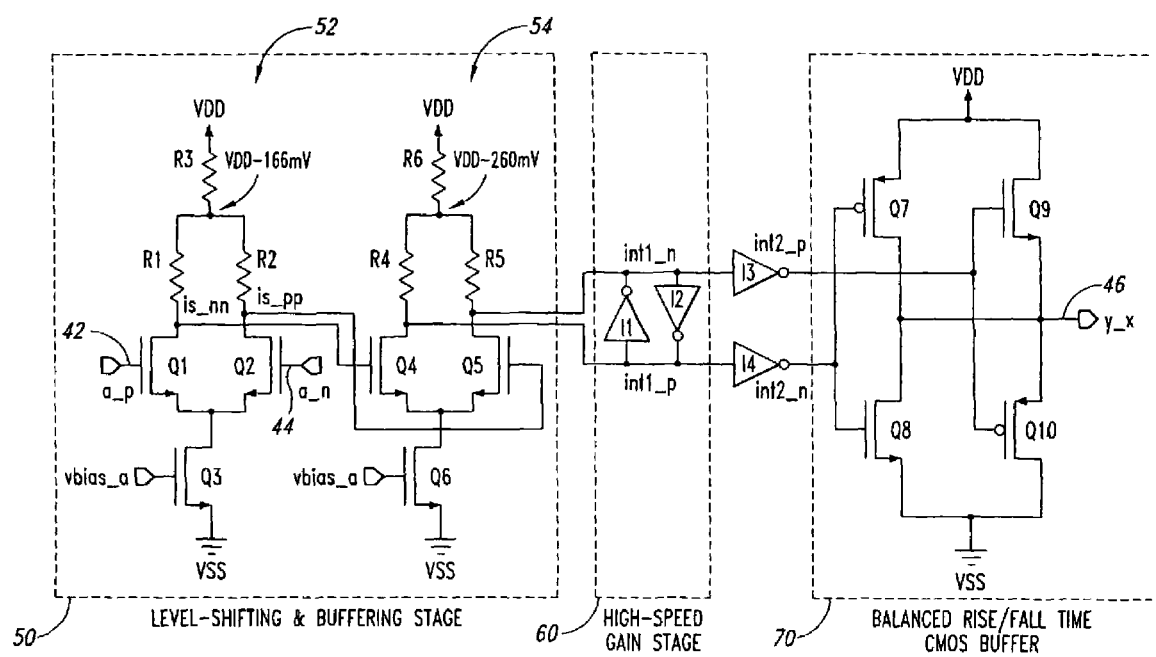
FIG. 3 is a schematic diagram of an improved differential logic to CMOS logic translation circuit, in accordance with an embodiment of the present invention.

FIG. 3 is a schematic diagram of an improved differential logic to CMOS logic translation circuit 40. In FIG. 3, the inputs are the signals 42, 44 a_p and a_n, and the output 46 is the signal y_x, a single CMOS logic signal instead of a pair of signals. On the input side in the example of FIG. 3, if the voltage on a_p is greater than the voltage on a_n, that represents a logic 1 or logic high; if the voltage on a_n is greater than the voltage on a_p, that represents a logic 0 or logic low. In the example of FIG. 3, if the input signal a_p is greater than a_n (i.e., logic high), then the output signal y_x will be logic high as well. If the input signal a_n is greater than a_p (i.e., logic low), then the output signal y_x will be logic low.

The level-shifting and buffering section 50 is shown on the left in a dashed-line box. This section can include differential structures 52, 54 that act as buffers and include transistors and passive elements such as resistors. For example, buffer 52 may include transistors Q1, Q2, Q3 and resistors R1, R2, R3; and buffer 54 may include transistors Q4, Q5, Q6 and resistors R4, R5, and R6. Components from standard library cells or the like may be used, and such library cells are typically substantially guaranteed by design to meet the high-speed requirements of many applications. Accordingly, this differential section can likely meet the speed requirements of an appropriate application. In addition, such library cells can be constructed with tight jitter specifications, so the differential section can also likely only introduce low amounts of jitter into the input signal.

In one example, the level shifting and buffering stage 50 is provided which includes transistors Q1-Q6 and resistors R1-R6 for receiving the differential logic input. A high speed gain stage 60 may receive the output of the level shifting and buffering stage 50, and the high speed gain stage 60 may pass its output to a balanced rise/fall time CMOS buffer stage 70.

As used herein, the term "transistor" or "switch" includes any switching element which can include, for example, n-channel or p-channel CMOS transistors, MOSFETs, FETs, JFETS, BJTs, or other like switching element or device. The particular type of switching element used is a matter of choice depending on the particular application of the circuit, and may be based on factors such as power consumption limits, response time, noise immunity, fabrication considerations, etc. Hence while embodiments of the present invention are described in terms of p-channel and n-channel transistors, it is understood that other switching devices can be used, or that the invention may be implemented using the complementary transistor types.

The first stage 50 buffers the input signal (a_p and a_n) and level-shifts its common-mode down from about the VDD rail, in an attempt to bring the common-mode voltage of the input signal near about VDD/2 (the nominal trip point of an equal-ratio inverter). The level shifting can be done in two stages 50 and 60, so as to maintain the differential pair transistors in saturation mode operation.

The resulting signals from stage 50 can be fed into a minimum-sized (i.e., "keeper") CMOS latch 60, shown in FIG. 3 in the center dashed-line box. In one example, the latch 60 includes inverters I1, I2 in an opposing parallel orientation. The positive-feedback mechanism of such a latch 60 can ensure that transitions in the int1_n and int1_p signals occur relatively quickly, which can allow for high-speed switching and, accordingly, high-speed operation of the overall translator. Furthermore, the latch 60 can pull int1_n and int1_p to near CMOS levels (i.e., about the supply rail levels). This mechanism can provide an initial translation to CMOS levels.

The int1_n and int1_p signals can then be buffered through CMOS inverters I3, I4 to substantially ensure that they reach proper CMOS levels. Next, the inverter outputs from I3, I4 can be fed into a balanced rise time/fall time CMOS buffer 70, shown in FIG. 3 on the right dashed-line box.

Skew in rise times and fall times across process corners can arise from the inherent performance differences between NMOS and PMOS transistors. If, for example, in one corner defined by the PVT conditions the NMOS transistor is relatively fast and the PMOS transistor is relatively slow, then the rise time of the output of a CMOS gate may be larger than its fall time. Although the transistors can be sized so that they would give substantially balanced rise and fall times, that balance would likely only apply for the particular optimized corner condition and not the others. Thus, testing the circuit at another corner would likely yield different or unmatched rise and fall times.

Traditionally, PMOS transistors are used to pull outputs to VDD (i.e., pull-up operation), and NMOS transistors are used to pull outputs to VSS (i.e., pull-down operation). In the balanced rise/fall time CMOS buffer stage 70 of the translator 40 as shown in FIG. 3, both NMOS and PMOS transistors can be used for pull-up and pull-down operations. In this way, regardless of how skewed the performance of each of the NMOS and PMOS transistors are, the total pull-up and pull-down strength of the buffer can be essentially the same, across all PVT corners. Accordingly, the rise time and fall times of the output signal (y_x) may also be approximately uniform across all such corners.

Referring to FIG. 3, in one embodiment of the invention, N-channel transistors Q1 and Q2 are connected in parallel with their sources coupled together and connected with the drain of N channel transistor Q3 which has its source coupled to ground. The drain of transistor Q1 is coupled with resistor R1, and the drain of transistor Q2 is coupled with resistor R2, and both resistors R1 and R2 are coupled with resistor R3 which is coupled with the supply, VDD. In one example, resistors R1, R2 and R3 form a passive network.

The gate of transistor Q1 is coupled with the input signal a_p while the gate of transistor Q2 is coupled with the input signal a_n wherein the input signals a_p and a_n are a pair of signals representing a differential logic value. The gate of transistor Q3 is coupled with a bias signal shown as vbias_a.

N channel transistors Q4 and Q5 are connected in parallel with their sources coupled together feeding the drain of N channel transistor Q6 that has its source coupled with ground. The drain of transistor Q4 is coupled with resistor R4, and the drain of transistor Q5 is coupled with resistor R5, and resistors R4 and R5 are connected with resistor R6 which is connected with the supply, VDD. The gate of transistor Q4 is driven by the drain of transistor Q1, while the gate of transistor Q5 is coupled with the drain of transistor Q2. The gate of transistor Q6 is coupled with a bias signal, shown as vbias_a, which in one example may be the same bias signal as is coupled with the gate of transistor Q3.

The vbias_a signal is a bias voltage that controls transistors Q3 and Q6 and hence the current flowing through the two branches/buffers 52, 54 in the level shifting and buffering stage 50 of FIG. 3. In one example, the vbias_a signal may be around 335 millivolts.

As shown in FIG. 3, inverters I1 and I2 are connected in an opposing, parallel relationship between the drains of transistors Q4, Q5. The output of the inverters I1, I2 form signals int1_n and int1_p shown in FIG. 3, and respectively drive inverter I3 and inverter I4. Inverter I3 outputs a signal shown as int2_p, and inverter I4 outputs a signal shown as int2_n.

The output of inverters I3 and I4 drive the balanced rise/fall time CMOS buffer 70 shown in FIG. 3.

In one example, the balanced rise/fall time CMOS buffer includes four transistors. In one example, P channel transistor Q7 is connected in series with N channel transistor Q8, wherein the source of transistor Q7 is coupled with the supply VDD, and the drain of transistor Q7 is coupled with the drain of transistor Q8 whose source is coupled with ground. The gates of transistor Q7 and Q8 are coupled with the output of inverter I4, in one example. Transistors Q9 and Q10 are connected in series, wherein N channel transistor Q9 has its drain coupled with the supply VDD, and its source coupled with the source of P channel transistor Q10 whose drain is coupled with ground. In the example of FIG. 3, the gates of transistor Q9, Q10 are coupled together with the output of inverter I3.

As shown in FIG. 3, the single ended output signal y_x is shown in one example as being derived from the connection between the drain of Q7 and the drain of Q8, as well as the source of Q9 and the source of Q10.

In overall operation, assuming in one example that input signal a_p is higher than the input signal a_n (hence, representing a logic 1 or logic high), then transistor Q1 turns while transistor Q2 turns off. When transistor Q1 turns on, it pulls the node LS_NN low and it keeps the node LS_PP at its current level, so in that sense LS_PP will be higher than LS_NN. When LS_PP is higher than LS_NN, this causes Q5 to turn on and Q4 to remain off. When Q5 turns on and Q4 remains off, the node int1_n is pulled lower than the node int1_p. Therefore, there is also a differential voltage across the two nodes int1_n and int1_p.

In one example, resistors R4 and R5 are of sufficient magnitude such that the voltage difference between the two nodes int1_n and int1_p is able to overpower the latch 60 formed by inverters I1 and I2, which in one example are regular CMOS inverters of a small size. Once nodes int1_n and int1_p are separated by a sufficient voltage through resistors R4 and R5, they overwrite the value of the latch, and the positive feedback mechanism of the inverters I1, I2 overtakes and separates the values of nodes int1_n and int1_p to a greater magnitude than if they were pulled apart by resistors R4 and R5 only. This provides a first transition to CMOS levels.

In one example, signals a_p and a_n have a common mode voltage, and nodes LS_PP and LS_NN have a common mode voltage that may be lower (for example, by 166 millivolts) than the common mode voltage of signals a_n and a_p. Likewise, signals int1_n and int1_p have a common mode voltage that is less (for example, by 260 millivolts) than signals a_p and a_n.

The two differential buffers 52, 54 at the beginning of stage 50 may provide multiple functions. First, they may move the common mode voltage of the differential signals down such that they will be interpreted properly by a CMOS converter. Also, the second buffer 54 will not only lower the common mode voltage of the differential signals, but will also increase the voltage swing.

Inverters I3 and I4 bring signals int1_n and int1_p to proper CMOS levels at int2_p and int2_n. Inverters I1 and I2 contend with transistors Q4 and Q5 and such contention may prevent the signals int1_n and int1_p from reaching CMOS levels, hence inverters I3 and I4 take the nearly CMOS levels of signals int1_n and int1_p and translate them to proper CMOS levels, shown as int2_n and int2_p.

In one example, the final output stage 70 is a balanced rise time-fall time CMOS buffer. In this example where the input logic value to the circuit 40 is logic high, the signal int2_n is going to be a low CMOS value, since int1_p was a high CMOS value or high nearly CMOS value. Likewise, the signal int2_p will be a high CMOS value whereas int1_n was a low CMOS value. With int2_n being low CMOS value, it will turn on transistor Q7 and turn off transistor Q8. Hence, the output node Y_X will be pulled to a CMOS high level. At the same time, transistor Q9 will be pulled high and turned on, and therefore pull the output node Y_X to CMOS high levels where transistor Q10 will be turned off. Therefore Q7 and Q9 will both serve to pull output node Y_X to a CMOS high value, which completes the translation from differential to CMOS levels. In this example, the differential input signals a_p and a_n (representing a logic 1 value) are converted into the a single logic output signal Y_X which is also logic high value using CMOS levels instead of differential levels. Conversely, when the circuit 40 receives an input of logic 0/low (i.e., when a_n 44 is higher than a_p 42), then the output y_x 46 will switch to a CMOS low level.

Embodiments of the present invention may have various advantages over previous translator architectures. Low jitter operation can be maintained throughout the circuit 40, since all current-switching and voltage-switching paths may be approximately equivalent. High-speed operation can be achieved with a minimal number of transistor devices because of the latch section 60. In comparison to conventional techniques such as described above with reference to FIG. 1 and FIG. 2, embodiments of the present invention may provide performance substantially independent across PVT corners. By maintaining substantially constant driving strength in both the pull-up and pull-down operations in the output stage 70, the rise time and fall time of the output signal y_x can be essentially matched regardless of the environmental (PVT) parameters.

The voltage swing of the signals in circuit 40 may be increased in various stages, in one example. In the level shifting and buffering stage 50, the second buffer 54 includes transistors Q4, Q5, Q6 and resistors R4 through R6. Resistors R4 and R5, which in one example are larger than resistors R1 and R2, expand the output voltage of the second buffer 54. In the high speed gain stage 60, this stage 60 takes the signals from the first stage 50 and once the latch 60 is tripped, the latch 60 pulls the two signals int1_n and int1_p apart from each other. Hence, the swing of the two signals int1_n and int1_p is expanded.

Figure 4:
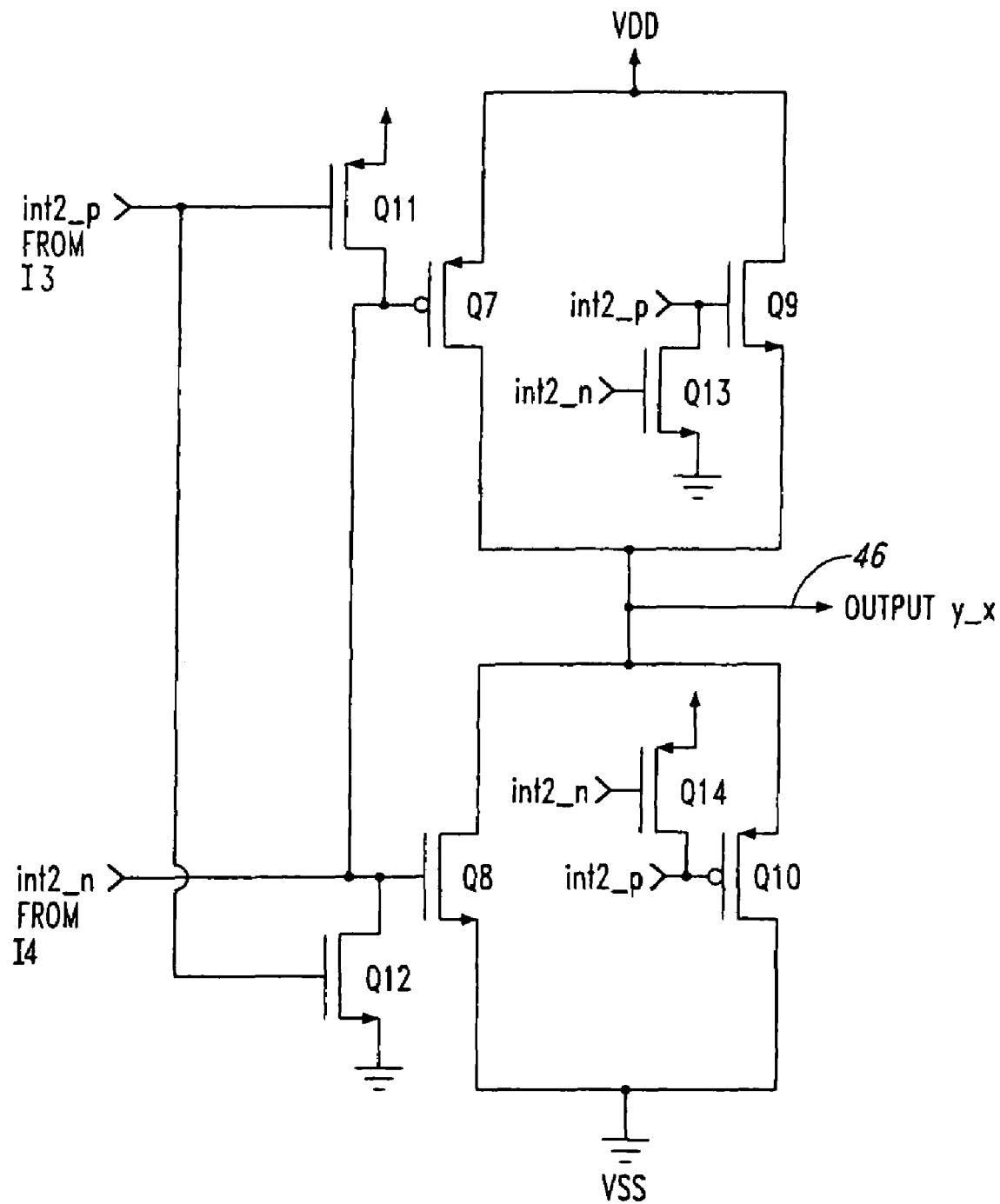
FIG. 4 is a schematic diagram of an improved CMOS buffer circuit, in accordance with an embodiment of the present invention.

FIG. 4 is a schematic diagram of an improved CMOS buffer circuit output stage 80. This circuit 80 may be used in place of the balanced rise/fall time CMOS buffer circuit 70 of FIG. 3. In FIG. 4, the output stage 80 includes additional transistors Q11-Q14 to suppress delay skew between the input signals to the circuit. For example, if the true and complimentary forms of the signals int2_p and int2_n arrive from disparate locations on an integrated circuit with substantial skew between them, contention can occur between the pull-up and pull-down paths in stage 70. For example, if int2_p transitions from a logic 0 to logic 1 before int2_n transitions from a logic 1 to logic 0, then the NMOS Q9 in the pull-up path can turn on before the NMOS Q8 in the pull-down path has turned off. The PMOS Q10 in the pull-up can remain off, while the PMOS Q7 in the pull-down can turn off. This may cause the output to begin transitioning from 0 to 1 levels through the pull-up NMOS Q9, but then equilibrium between the pull-up NMOS Q9 and the pull-down NMOS Q8 occurs, and the output waveform can distort.

The additional transistors Q11-Q14 included in FIG. 4 can suppress the skew between the input signals by turning off their associated transistors faster. Following the example given above, when the signal int2_p transitions from 0 to 1, the pull-up NMOS Q9 can turn on, and the skew-suppressing NMOS Q12 connected to the gate of the pull-down NMOS Q8 can also turn on to pull that gate low. Thus, the pull-down NMOS Q8 can be turned off and contention can be avoided with the pull-up NMOS Q9.

Stated differently, if one of the signals int2_p and int2_n arrives earlier, it will turn on the supplementary transistors to start pulling the other slower node (i.e., the node with the signal that has not yet arrived) in the desired direction before the faster node switches, and this provides a temporary solution until the slower node catches up and switches to the appropriate value.

In one example in FIG. 4, p channel transistor Q11 has its source coupled with the supply, VDD, and its drain coupled with the gate of transistor Q7. The gate of transistor Q11 is coupled with the output of inverter I3 (input). N channel transistor Q12 has its drain coupled with the gate of transistor Q8 and its source coupled with ground. The gate of transistor Q12 is coupled with the output of inverter I3. N channel transistor Q13 has its drain coupled with the gate of transistor Q9 and its source coupled with ground. The gate of transistor Q13 is coupled with the output of inverter I4. P channel transistor Q14 has its source coupled with the supply, VDD, and its drain coupled with the gate of transistor Q10. The gate of transistor Q14 is coupled with the output of inverter I4, in one example.

By way of example only, the circuit elements of FIGS. 3-4 may be sized such that Q1 and Q2 are approximately the same size; Q4 and Q5 are approximately the same size; inverters I1 and I2 are approximately the same size; inverters I3 and I4 are approximately the same size; resistors R1 and R2 are approximately the same value; and resistors R4 and R5 are approximately the same value.

In one example, the resistance of resistor R6 is greater than R3, so that the common mode of int1_p and int1_n is lower than the common mode of ls_pp and ls_nn. Resistors R4 and R5 may also be bigger, but not significantly bigger, than R1 and R2, so that the swing of int1_p and int1_n is greater than the swing of ls_pp and ls_nn. In one example, inverters I1 and I2 may be minimum size inverters or thereabout.

In one example, transistors Q4 and Q5 can be sized such that the latch formed by inverters I1 and I2 can be written to under all process, voltage, and temperature conditions. To that effect, transistors Q4, Q5 may be greater in size than transistors Q1 and Q2, and transistor Q6 may be bigger than transistor Q3.

In one embodiment, transistor Q9 is approximately equal to transistor Q8, and transistor Q7 is approximately equal to Q10. Depending on the implementations, adjustments may be made such that the rise time and the fall time of the output of the circuit formed by Q7, Q8, Q9 and Q10 is approximately equal, in one example.

Using embodiments as described herein, jitter performance can remain consistently good regardless of changing process, temperature, or voltage. Such embodiments can function at speeds of about 3.6 Gbps, for example, in some process technologies, while maintaining better than about 21 ps data-dependent jitter (DDJ) and better than about a 45% duty cycle (for a 50% duty cycle input), across all process, temperature, and voltage corners.

Of course, other transistor types than those described above could also be used. For example, bipolar transistors (e.g., NPN BJTS) could be used in place of the NMOS transistors in other implementations. Alternatively, PMOS transistors may be used in place of the NMOS transistors as shown in the level-shifting and buffering stage of FIG. 3. In such an implementation, ground-referenced differential signals instead of VDD-referenced could be used.

Embodiments of the present invention can be used in a variety of circuits where translators may be used, such as in non-volatile memory circuits, programmable logic devices, semiconductors, microprocessors or micro-controllers, logic or programmable logic devices, clock circuits, integrated circuits for high speed networking or telecommunication applications, or the like.

It is understood that while the various aspects of the particular embodiment set forth herein has been described in detail, the present invention could be subject to various changes, substitutions, and alterations without departing from the spirit and scope of the invention. As but a few examples, the particular voltage levels described herein could be changed to different voltage levels, depending on the particular application and processing technologies involved.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to embodiments thereof, it will be understood by those skilled in the art that various other changes in the form and details may be made without departing from the spirit and scope of the invention.

What is claimed is:

1. A translator for translating differential input signals into a CMOS logic output, the translator comprising:
    a level-shifting and buffering stage configured to receive the differential input signals and to provide a set of level shifted signals;
    a gain stage configured to receive the set of level shifted signals and to provide a set of increased swing signals; and
    a CMOS buffer configured to receive the set of increased swing signals and to provide the CMOS logic output, wherein the CMOS buffer comprises at least a first path configured to receive a first portion of the increased swing signals, the first path comprising a first and second transistor connected in series, and wherein the first transistor is coupled between a supply voltage and the second transistor, and the second transistor is coupled between ground and the first transistor.

2. The translator of claim 1, wherein the level-shifting and buffering stage comprises:
    a first passively-loaded differential structure configured to receive the differential input signals and to provide a set of intermediate level shifted signals; and
    a second passively-loaded differential structure configured to receive the set of intermediate level shifted signals and to provide the set of level shifted signals.

3. The translator of claim 1, wherein the level shifting and buffering stage includes a first buffer receiving the differential input signals and a second buffer, said second buffer receiving an output from the first buffer.

4. The translator of claim 3, wherein the first buffer includes:
    a first transistor receiving a first input signal of said differential input signals;
    a second transistor receiving a second input signal of said differential input signals, the first transistor and the second transistor connected in parallel at a node; and
    a third transistor connected between the node and ground.

5. The translator of claim 4, wherein the first and second transistor are n-channel transistors.

6. The translator of claim 4, wherein the first buffer includes at least one pull-up resistor, and wherein the first and second transistors are coupled with at least one pull-up resistor.

7. The translator of claim 1, wherein the gain stage includes: one or more cross-coupled inverters coupled with the set of level shifted signals.

8. The translator of claim 1, further comprising:
    a pair of CMOS inverters receiving the set of increased swing signals, said CMOS inverters bringing the set if increased swing signals to CMOS logic voltage levels.

9. The translator of claim 1, wherein the CMOS buffer further comprises
    a second path receiving a second of said set of increased swing signals, said first path and said second path coupled together to form the CMOS logic output.

10. The translator of claim 1, wherein
    the first and second transistors are configured to be controlled by the first portion of said set of increased swing signals.

11. The transistor of claim 9, wherein the second path includes:
    a third transistor and a fourth transistor connected in series, the third transistor coupled between a supply voltage and the fourth transistor, the fourth transistor coupled between ground and the third transistor.

12. The translator of claim 1, wherein the first transistor is a p-channel transistor.

13. The translator of claim 1, further comprising: means for reducing signal skew within the CMOS buffer.

14. A method of translating a differential logic signal to a CMOS logic signal, the method comprising:
    buffering the differential logic input signal to provide a set of reduced common mode signals;
    providing a gain stage to form a set of increased swing signals from the set of reduced common mode signals; and
    providing a CMOS buffer to form the CMOS logical signal from the set of increased swing signals.

15. The method of claim 14, wherein the buffering operation includes providing a first and a second buffer in series.

16. The method of claim 14, further comprising: reducing signal skew within the CMOS buffer.

17. An integrated circuit comprising:
    at least one set of differential logic signals;
    a translator for translating the at least one set of differential logic signals into a CMOS logic signal, the translator comprising:
        a buffering and level shifting stage configured to receive the at least one set of differential logic signals and to provide a first output;
        a gain stage coupled with the first output and providing a second output; and
        a CMOS buffer stage coupled with the second output and providing the CMOS logic signal.

18. The integrated circuit of claim 17, wherein the buffering and level shifting stage of the translator includes:
    a first and second buffer coupled in series, the first buffer receiving the at least one set of differential logic signals.

19. The integrated circuit of claim 17, wherein the gain stage of the translator includes: one or more cross-coupled inverters.

20. The integrated circuit of claim 17, wherein the CMOS buffer stage of the transistor further comprises: means for reducing signal skew within the CMOS buffer.

* * * * *